US012812947B2

(12) United States Patent
Chang et al.

(10) Patent No.: US 12,812,947 B2
(45) Date of Patent: Nov. 24, 2026

(54) SPACER FORMATION METHOD FOR MULTI-GATE DEVICE AND STRUCTURES THEREOF

(71) Applicant: Taiwan Semiconductor Manufacturing Company, Ltd., Hsinchu (TW)

(72) Inventors: Che-Lun Chang, Hsinchu (TW); Wei-Yang Lee, Taipei City (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 507 days.

(21) Appl. No.: 18/159,631

(22) Filed: Jan. 25, 2023

(65) Prior Publication Data

US 2024/0113203 A1 Apr. 4, 2024

Related U.S. Application Data

(60) Provisional application No. 63/377,692, filed on Sep. 29, 2022.

(51) Int. Cl.
*H10D 64/01* (2025.01)
*H10D 30/67* (2025.01)
(Continued)

(52) U.S. Cl.
CPC ....... *H10D 64/021* (2025.01); *H10D 30/6735* (2025.01); *H10D 30/6757* (2025.01);
(Continued)

(58) Field of Classification Search
CPC ............ H10D 64/021; H10D 30/6735; H10D 30/6757; H10D 62/151; H10D 64/017;
(Continued)

(56) References Cited

U.S. PATENT DOCUMENTS 8,796,666 B1 8/2014 Huang et al.
8,815,712 B2 8/2014 Wan et al.
(Continued)

FOREIGN PATENT DOCUMENTS

TW 201801329 A 1/2018
TW 202147462 A 12/2021

*Primary Examiner* — Marlon T Fletcher
*Assistant Examiner* — Da Wei Lee
(74) *Attorney, Agent, or Firm* — HAYNES AND BOONE, LLP

(57) ABSTRACT

A method includes providing a fin extending from a substrate, the fin including a plurality of semiconductor channel layers, and where a gate is disposed over the fin. A first spacer layer is deposited over the gate and over the fin in a source/drain region. The first spacer layer has a first etch rate. A second spacer layer is deposited over the first spacer layer. The second spacer layer has a second etch rate less than the first etch rate. The plurality of semiconductor channel layers are removed from the source/drain region to form a trench having a funnel shape. After forming the trench, inner spacers are formed along a sidewall surface of the trench. In various embodiments, lateral sidewall surfaces of each semiconductor channel layer of the plurality of semiconductor channel layers is substantially free of an inner spacer material.

20 Claims, 12 Drawing Sheets

(51) Int. Cl.
*H10D 62/13* (2025.01)
*H10D 84/01* (2025.01)
*H10D 84/03* (2025.01)

(52) U.S. Cl.
CPC ......... *H10D 62/151* (2025.01); *H10D 64/017* (2025.01); *H10D 84/0128* (2025.01); *H10D 84/013* (2025.01); *H10D 84/0147* (2025.01); *H10D 84/0158* (2025.01); *H10D 84/038* (2025.01)

(58) Field of Classification Search
CPC ............. H10D 84/0128; H10D 84/013; H10D 84/0147; H10D 84/0158; H10D 84/038; H10D 30/797
See application file for complete search history.

(56) References Cited

U.S. PATENT DOCUMENTS

| | | | | |
|---|---|---|---|---|
| 8,963,258 | B2 | 2/2015 | Yu et al. | |
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,576,814 | B2 | 2/2017 | Wu et al. | |
| 2013/0285116 | A1 | 10/2013 | Lochtefeld et al. | |
| 2020/0006577 | A1* | 1/2020 | Ching | H10D 30/6735 |
| 2020/0027959 | A1* | 1/2020 | Cheng | B82Y 10/00 |
| 2020/0381531 | A1* | 12/2020 | Chung | B82Y 10/00 |
| 2020/0381545 | A1* | 12/2020 | Chiang | H10D 30/014 |
| 2021/0050427 | A1* | 2/2021 | Ching | H10D 30/62 |

* cited by examiner

SPACER FORMATION METHOD FOR MULTI-GATE DEVICE AND STRUCTURES THEREOF

CROSS-REFERENCE TO RELATED APPLICATIONS

This application claims priority to U.S. Prov. App. Ser. No. 63/377,692, filed Sep. 29, 2022, the entire disclosure of which is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, despite having many desirable features, GAA transistor fabrication has continued to face challenges as a result of the ongoing scaling down of semiconductor IC dimensions.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
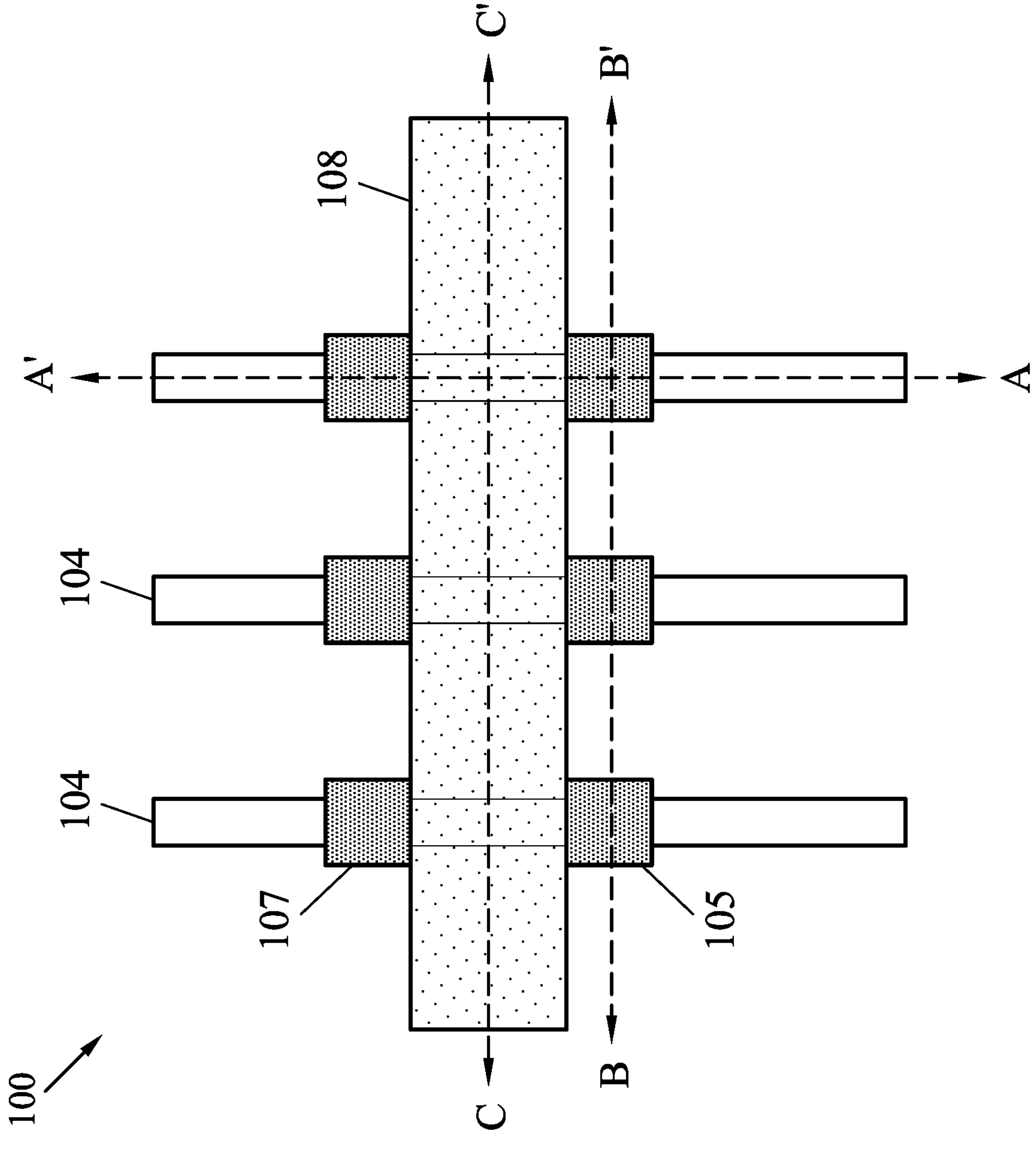
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors. Multi-gate transistors include those transistors whose gate structures are formed on at least two-sides of a channel region. These multi-gate devices may include a P-type transistor or an N-type transistor. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

For GAA transistors, inner spacers are formed between lateral ends of adjacent semiconductor channel layers, and between a source/drain feature and a gate structure formed in a channel region between adjacent semiconductor channel layers. In an exemplary GAA transistor process flow, fins may be formed that include an epitaxial stack of layers (e.g., alternating semiconductor channel layers and dummy layers) and one or more dummy gate stacks formed over the epitaxial stack of layers. The dummy gate stacks include one or more sidewall spacers. In some cases, formation of the sidewall spacers may also result in sidewall spacer portions which remain on sidewalls of at least a lower portion of the epitaxial stack of layers in source/drain regions of the device. After formation of the sidewall spacers, a source/drain etch process is performed to remove portions of the epitaxial stack of layers in source/drain regions of the device adjacent to the dummy gate stacks. The source/drain etch process forms trenches, in the source/drain regions of the device, that are disposed between the sidewall spacer portions which were previously formed on the sidewalls of at least the lower portion of the epitaxial stack of layers in the source/drain regions. In an example, a trench formed in the source/drain region may have a trench width defined by a distance between opposing sidewall spacer portions on either side of the trench. The trenches formed by the source/drain etch process expose sidewall surfaces of lateral ends of the epitaxial stack of layers, including sidewall surfaces of the semiconductor channel layers and the dummy layers (e.g., also referred to as a fin sidewall surface). In some cases, the trench width may be substantially equal to a width of the lateral end of the epitaxial stack of layers or substantially equal to a width of the fin sidewall surface. A dummy layer recess process may then be performed to laterally etch the dummy layers to form recesses along sidewalls of the previously formed trenches between lateral ends of adjacent semiconductor channel layers.

Thereafter, an inner spacer material is deposited over the device, including along sidewalls of the trenches, within the recesses, and over the opposing sidewall spacer portions on either side of each of the trenches. In particular, deposition of the inner spacer material over the opposing sidewall spacer portions on either side of each of the trenches effectively reduces the trench width and causes at least part of the fin sidewall surface to be covered by the deposited inner spacer material, which in turn degrades a process window for a subsequent inner spacer trim process. Thus, when the deposited inner spacer material is subsequently etched-back (trimmed) to form inner spacers along the sidewalls of the trenches between the lateral ends of adjacent semiconductor channel layers, and because of the reduced process window for the inner spacer etch process, at least some of the inner spacer material may remain on lateral ends of at least one of the semiconductor channel layers of the epitaxial stack of layers (e.g., at least the bottommost semiconductor channel layer). As a result, source/drain features that are subsequently formed within the trenches will not only contact the adjacent inner spacers and the semiconductor channel layers with lateral ends that are substantially free of inner spacer material, but also one or more semiconductor channel layers (e.g., such as the bottommost semiconductor channel layer) with at least some inner spacer material disposed on a lateral end (e.g., on a fin sidewall surface of the semiconductor channel layer). The contact resistance between the source/drain features and the semiconductor channel layers will thus be increased, and the epitaxial growth quality of the source/drain features will be degraded.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having improved dummy gate sidewall spacers for inner spacer formation. In some embodiments, fins including an epitaxial stack of layers (e.g., alternating semiconductor channel layers and dummy layers) and one or more dummy gate stacks formed over the epitaxial stack of layers are provided. As noted above, the dummy gate stacks include one or more sidewall spacers. However, in accordance with embodiments of the present disclosure, the dummy gate sidewall spacers may include a multi-layer sidewall spacer with constituent layers having different etch rates. In some cases, the dummy gate sidewall spacers include a bilayer sidewall spacer where the two layers of the bilayer sidewall spacer each have different etch rates. In this example, a first layer of the bilayer sidewall spacer (e.g., inner sidewall spacer layer) is formed over the dummy gates and over the epitaxial stack of layers in source/drain regions of the device. Thereafter, a second layer of the bilayer sidewall spacer (e.g., outer sidewall spacer layer) is formed over the first layer of the bilayer sidewall spacer. In some cases, the first layer of the bilayer sidewall spacer has a greater etch rate than the second layer of the bilayer sidewall spacer. Generally, for a multi-layer sidewall spacer (e.g., more than two layers), the sidewall spacer layer that is deposited first (e.g., innermost sidewall spacer layer), and is thus in direct contact with the dummy gates and the epitaxial stack of layers in source/drain regions of the device, has the highest etch rate. After forming the first and second layers of the bilayer sidewall spacer, a sidewall spacer etch-back process and source/drain etch process is performed. In some cases, the sidewall spacer etch-back process and the source/drain etch process may be performed as separate etch processes. Alternatively, the sidewall spacer etch-back process and the source/drain etch process may be performed as a single etch process, for example, where a single etch process forms trenches in source/drain regions while also forming sidewall spacer portions. In some embodiments, and because of the higher etch rate of the first layer of the bilayer sidewall spacer, the sidewall spacer etch-back process and the source/drain etch process will etch the first layer of the bilayer sidewall spacer faster than the second layer of the bilayer sidewall spacer. As a result, the trenches formed in the source/drain regions (e.g., by the source/drain etch process), and which have a trench width defined by a distance between opposing sidewall spacer portions on either side of the trench, will have a funnel shape (e.g., a top width of the trench is greater than a bottom width of the trench) that is formed by a combination of the sidewall spacer etch-back process and the source/drain etch process. In some cases, the funnel shape formation may also be referred to as a lateral push of the bilayer sidewall spacer. In various embodiments, the trench funnel shape provides for at least a top portion of the trench to have a width that is greater than a width of the lateral end of the adjacent epitaxial stack of layers (the fin sidewall surface).

After the dummy layer recess process, an inner spacer material is deposited over the device, including along sidewalls of the trenches, within the recesses (e.g., within which inner spacers are defined), and over the opposing sidewall spacer portions on either side of each of the trenches. The deposition of the inner spacer material over the opposing sidewall spacer portions on either side of each of the trenches once again effectively reduces the trench width; however, because of the funnel shape of the trenches, the process window for the subsequent inner spacer trim process remains sufficiently large. Thus, when the deposited inner spacer material is subsequently etched-back (trimmed) to form the inner spacers, substantially no inner spacer material remains on lateral ends of the semiconductor channel layers of the epitaxial stack of layers, including the bottommost semiconductor channel layer. As a result, source/drain features that are subsequently formed within the trenches will contact the adjacent inner spacers and the semiconductor channel layers, each of which has lateral ends (e.g., fin sidewall surfaces) that are substantially free of inner spacer material. Therefore, contact resistance between the source/drain features and the semiconductor channel layers will be improved (reduced) to provide enhanced device performance, epitaxial growth quality of the source/drain features will be improved, and there is no extra process cost. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
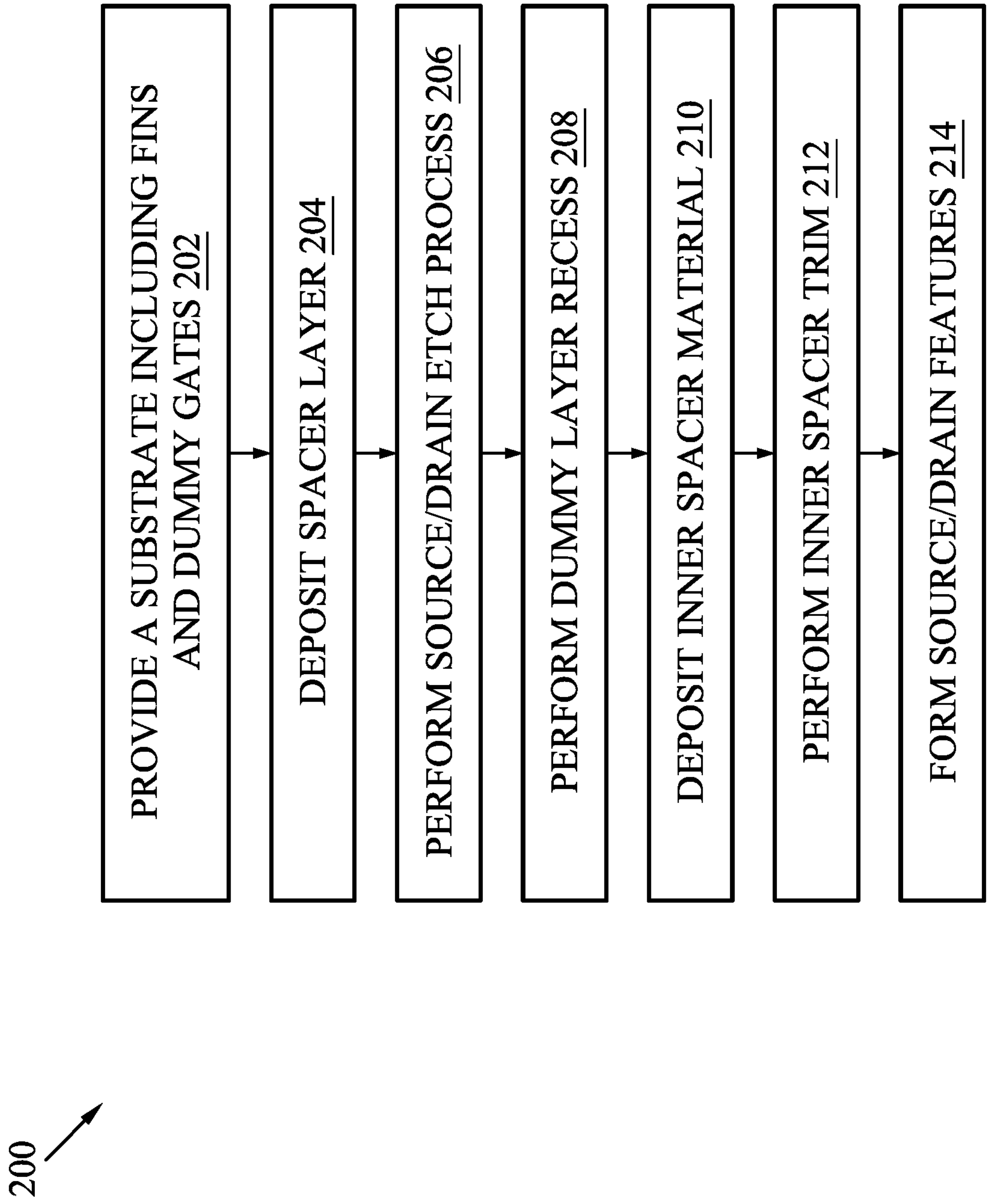
FIG. 2 is a flow chart of a method of fabricating a semiconductor device 300, according to one or more aspects of the present disclosure.

Referring to FIG. 2, illustrated therein is a method 200 of semiconductor fabrication including fabrication of a semiconductor device 300 (e.g., which includes a multi-gate device) having improved dummy gate sidewall spacers for inner spacer formation, in accordance with various embodiments. The method 200 is discussed below with reference to fabrication of GAA transistors. However, it will be understood that aspects of the method 200 may be equally applied to other types of multi-gate devices, or to various types of devices implemented by the multi-gate devices such as static random-access memory (SRAM) devices, core (logic) devices, analog devices, or other types of devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

In addition, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 includes a plurality of semiconductor devices (e.g., transistors), including P-type transistors, N-type transistors, etc., which may be interconnected. Moreover, it is noted that the process steps of method 200, including any descriptions given with reference to the figures are merely exemplary and are not intended to be limiting beyond what is specifically recited in the claims that follow.

Figure 3A:
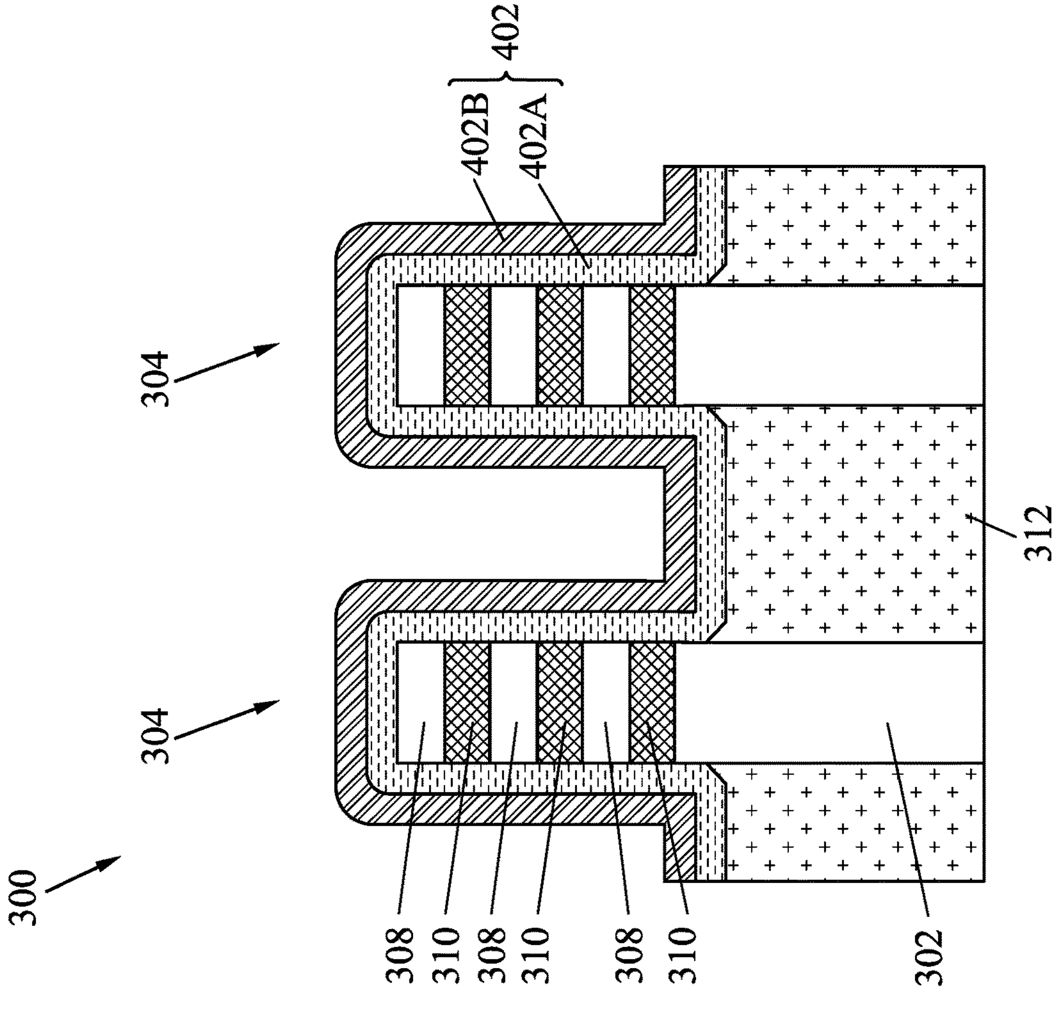
FIGS. 3A, 4A, 5A, 6A, 7A, and 9A provide cross-sectional views of an embodiment of the semiconductor device 300 along a plane substantially parallel to a plane defined by section BB' of FIG. 1, in accordance with some embodiments.
Figure 3B:
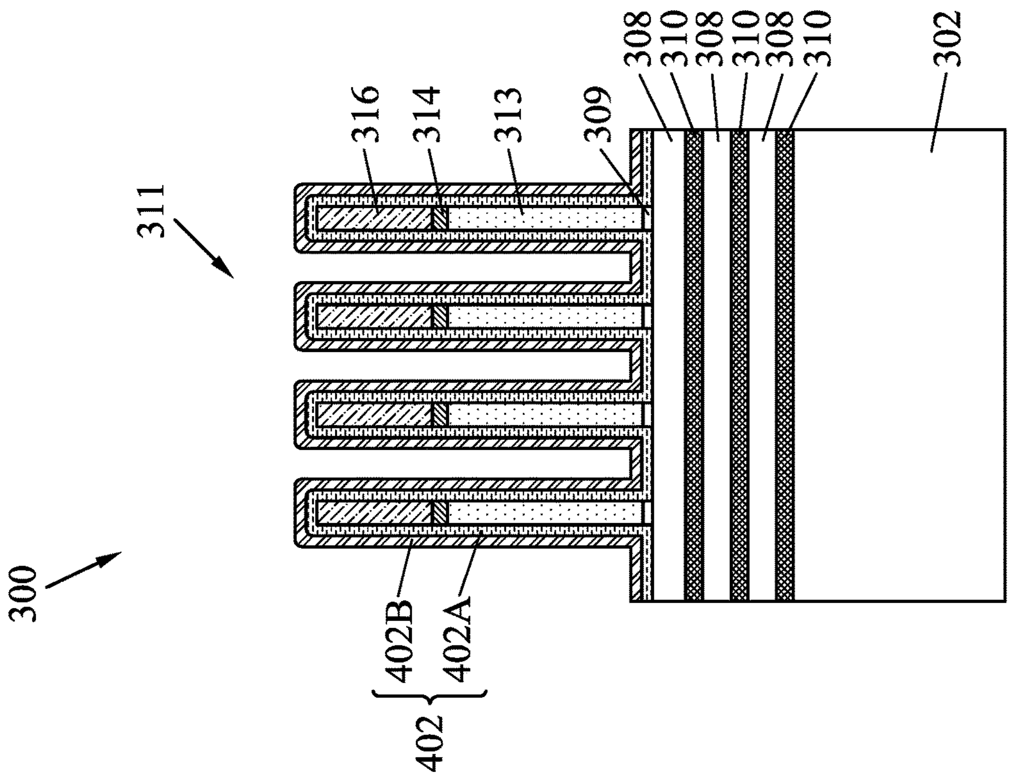
FIGS. 3B, 4B, 5B, 6B, 7B, and 9B provide cross-sectional views of an embodiment of the semiconductor device 300 along a plane substantially parallel to a plane defined by section AA' of FIG. 1, according to some embodiments.

The method 200 begins at block 202 where a substrate including fins and dummy gates is provided. Referring to the example of FIGS. 3A/3B, in an embodiment of block 202, a substrate including fins 304 and dummy gate stacks 311 is provided. FIG. 3A provides a cross-sectional view of an embodiment of the semiconductor device 300 along a plane substantially parallel to a plane defined by section BB' of FIG. 1 which traverses a source/drain region of the device 300. FIG. 3B provides a cross-sectional view of an embodiment of the semiconductor device 300 along a plane substantially parallel to a plane defined by section AA' of FIG. 1. In some embodiments, the substrate may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

The fins 304, which include layers 308 and 310, may be formed by growing epitaxial layers of a first composition (e.g., which are subsequently patterned to form the layers 310) interposed by epitaxial layers of a second composition (e.g., which are subsequently patterned to form the layers 308). In an embodiment, the epitaxial layers of the first composition (e.g., used to form layers 310) are SiGe and the epitaxial layers of the second composition (e.g., used to form layers 308) are silicon (Si). However, other embodiments are possible including those that provide for a first composition and a second composition having different oxidation rates and/or etch selectivity. For example, in some embodiments, either of the epitaxial layers of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers of the first composition or the second composition may be performed by a molecular beam epitaxy (MBE) process, a metalorganic chemical vapor deposition (MOCVD) process, and/or other suitable epitaxial growth processes. It is also noted that while the layers 308, 310 are shown as having a particular stacking sequence within the fins 304, where the layer 308 is the topmost layer of the stack of layers 308, 310, other configurations are possible. For example, in some cases, the layer 310 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

The fins 304 may be fabricated using suitable processes including photolithography and etch processes. The photolithography process may include forming a photoresist layer over the device 300, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the substrate, and layers formed thereupon, while a wet and/or dry etch process forms trenches in unprotected regions through the epitaxial layers of the first composition and the second composition, and into the substrate, thereby leaving the plurality of extending fins 304.

In various embodiments, each of the fins 304 includes a substrate portion 302 formed from the substrate, the layers 310 (e.g., including the first composition), and the layers 308 (e.g., including the second composition). In some examples, the epitaxial layers 308 (e.g., including the second composition), or portions thereof, may form a channel region of a GAA transistor of the device 300. For example, the layers 308 may be referred to as semiconductor channel layers that are used to form a channel region of a GAA transistor. In various embodiments, the semiconductor channel layers (e.g., the layers 308 or portions thereof) may include nanosheet channel(s), nanowire channel(s), bar-shaped channel(s), and/or other suitable channel configurations.

It is noted that while the fins 304 are illustrated as including three (3) layers of the epitaxial layer 310 and three (3) layers of the epitaxial layer 308, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some examples, the number of epitaxial layers, and thus the number of semiconductor channel layers, is selected based on the device type being implemented by the GAA transistor (e.g., such as core (logic) devices, SRAM devices, or analog devices, among others). In some embodiments, the number of epitaxial layers 308, and thus the number of semiconductor channel layers, is between 3 and 10.

In some embodiments, the epitaxial layers 310 each have a thickness range of about 4-8 nanometers (nm). In some cases, the epitaxial layers 308 each have a thickness range of about 4-8 nm. As noted above, the epitaxial layers 308 may serve as channel region(s) for a subsequently formed multi-gate device (e.g., a GAA transistor) and its thickness may be chosen based at least in part on device performance considerations. The epitaxial layers 310 may serve to define a gap distance between adjacent channel region(s) for the subsequently formed multi-gate device and its thickness may also be chosen based at least in part on device performance considerations.

In a further embodiment of block 202, and still with reference to FIGS. 3A/3B, recessed shallow trench isolation (STI) features 312 are formed interposing the fins 304. In some examples, after forming the fins 304, the trenches interposing the fins 304 may be filled with a dielectric material. In some embodiments, the dielectric material used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process.

After depositing the dielectric material, a CMP process may be performed to remove excess portions of the dielectric material and to planarize a top surface of the device 300, and an STI recess process (e.g., including a wet and/or dry etch process) is performed to recess the dielectric material between the fins 304 and form recessed STI features 312. In various examples, the fins 304 extend above the recessed STI features 312 such that the epitaxial stack of layers 308, 310 of each of the fins 304 is exposed.

In a further embodiment of block 202, and still referring to FIGS. 3A/3B, dummy gates are formed. While the present discussion is directed to a replacement gate (gate-last) process whereby a dummy gate structure is formed and subsequently replaced, other configurations may be possible. In some embodiments, gate stacks 311 are formed over the fins 304 of the semiconductor device 300. In an embodiment, the gate stacks 311 are dummy (sacrificial) gate stacks that are subsequently removed and replaced by the final gate stack at a subsequent processing stage of the device 300. For example, the gate stacks 311 may be replaced at a later processing stage by a high-K dielectric layer (HK) and metal gate electrode (MG). In some embodiments, the gate stacks 311 are formed over the substrate and are at least partially disposed over the fins 304 of the semiconductor device 300. The portion of the fins 304 underlying the gate stacks 311 may be referred to as the channel region. The gate stacks 311 may also define a source/drain region of the fins 304, for example, as the regions of the fins 304 adjacent to and on opposing sides of the channel region. In some embodiments, sidewall spacers may also be formed on sidewalls of the gate stacks 311, as discussed below.

In some embodiments, the gate stacks 311 include a dielectric layer 309 and an electrode layer 313 over the dielectric layer. The gate stacks 311 may also include one or more hard mask layers 314, 316. In some embodiments, the hard mask layer 314 may include a nitride layer, and the hard mask layer 316 may include an oxide layer. In some embodiments, the gate stacks 311 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stacks 311 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer 309 of the gate stacks 311 includes silicon oxide. Alternatively, or additionally, the dielectric layer 309 may include silicon nitride, a high-K dielectric material or other suitable material. In some embodiments, the electrode layer 313 may include polycrystalline silicon (polysilicon). In some embodiments, the nitride of the hard mask layer 314 includes a pad nitride layer that may include $Si_3N_4$, silicon oxynitride or silicon carbide. In some embodiments, the oxide of the hard mask layer 316 includes a pad oxide layer that may include $SiO_2$.

The method then proceeds to block 204 where a spacer layer is deposited. In particular, the spacer layer may be deposited after formation of the gate stacks 311. Still referring to the example of FIGS. 3A/3B, in an embodiment of block 204, a spacer layer 402 is deposited over the device 300. In some embodiments, the spacer layer 402 may be a conformal layer. The spacer layer 402 may be deposited over and on sidewalls of the gate stacks 311, as well as over and on sidewalls of the fins 304 (e.g., in source/drain regions of the device 300). In some embodiments, the spacer layer 402 includes multiple layers, such as a spacer layer 402A and a spacer layer 402B formed over the spacer layer 402A, which may include main spacer layers, liner layers, and the like. In an example, the spacers layers 402A and 402B each have different etch rates. For example, in some cases, the spacer layer 402A has a greater etch rate than the spacer layer 402B. As a result, the process window for a subsequent inner spacer trim process remains sufficiently large, as discussed below. Generally, the spacer layers 402A, 402B may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some cases, the spacer layer 402A may include a combination of elements selected from a group including Si, C, O, and N, where the spacer layer 402A has a first ratio of constituent elements and a first density. In some cases, the spacer layer 402A may have a thickness in a range of between about 3-6 nm and a dielectric constant (K value) in a range of between about 2.0-5.5. In some embodiments, the spacer layer 402B may also include a combination of elements selected from the group including Si, C, O, and N. However, the spacer layer 402B has a second ratio of constituent elements (different than the first ratio of constituent elements of the spacer layer 402A) and a second density (different than the first density of the spacer layer 402A). In various embodiments, the differences in the ratios of constituent elements and the differences in the densities of the spacer layers 402A, 402B will determine the difference in etch rates between each of the spacer layer 402A and the spacer layer 402B. In some cases, the spacer layer 402B may also have a thickness in a range of between about 3-6 nm. Thus, the total thickness of the spacer layer 402 may be in a range of between about 6-12 nm. In various embodiments, a ratio of the K value of the spacer layer 402B to the K value of the spacer layer 402A is in a range of between about 0.8-2.5. By way of example, the spacer layers 402A, 402B may be formed by conformally depositing a dielectric material over the device 300 using processes such as a CVD process, a subatmospheric CVD (SACVD) process, a flowable CVD process, an ALD process, a PVD process, or other suitable process.

Figure 4B:
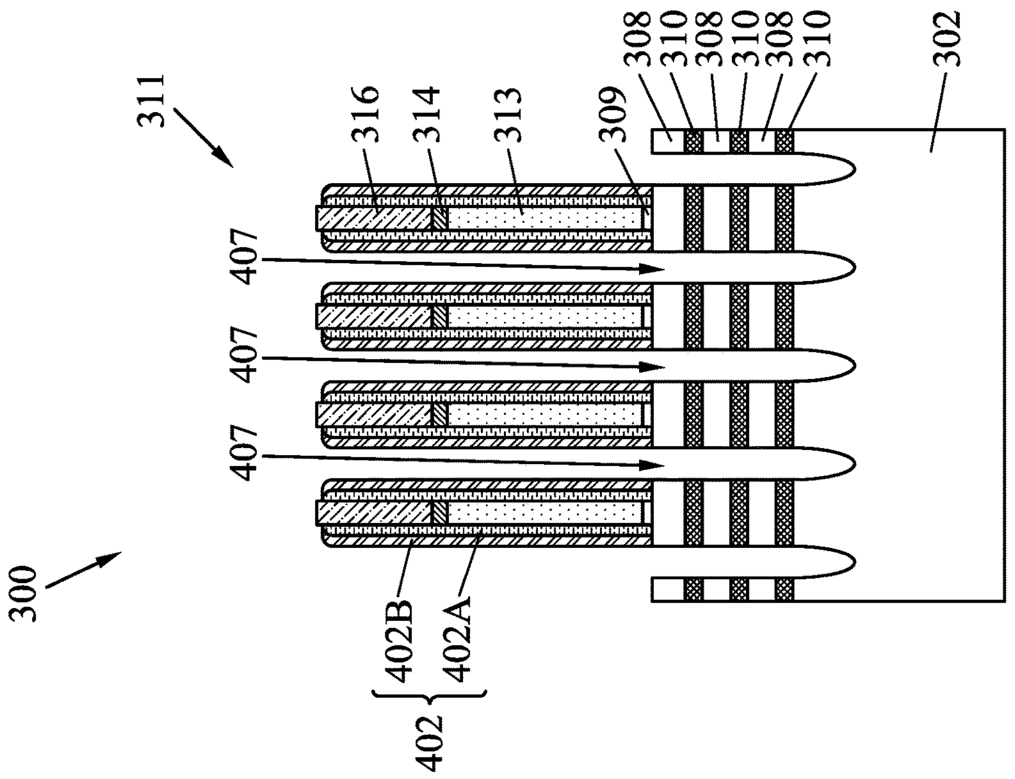
Figure 4A:
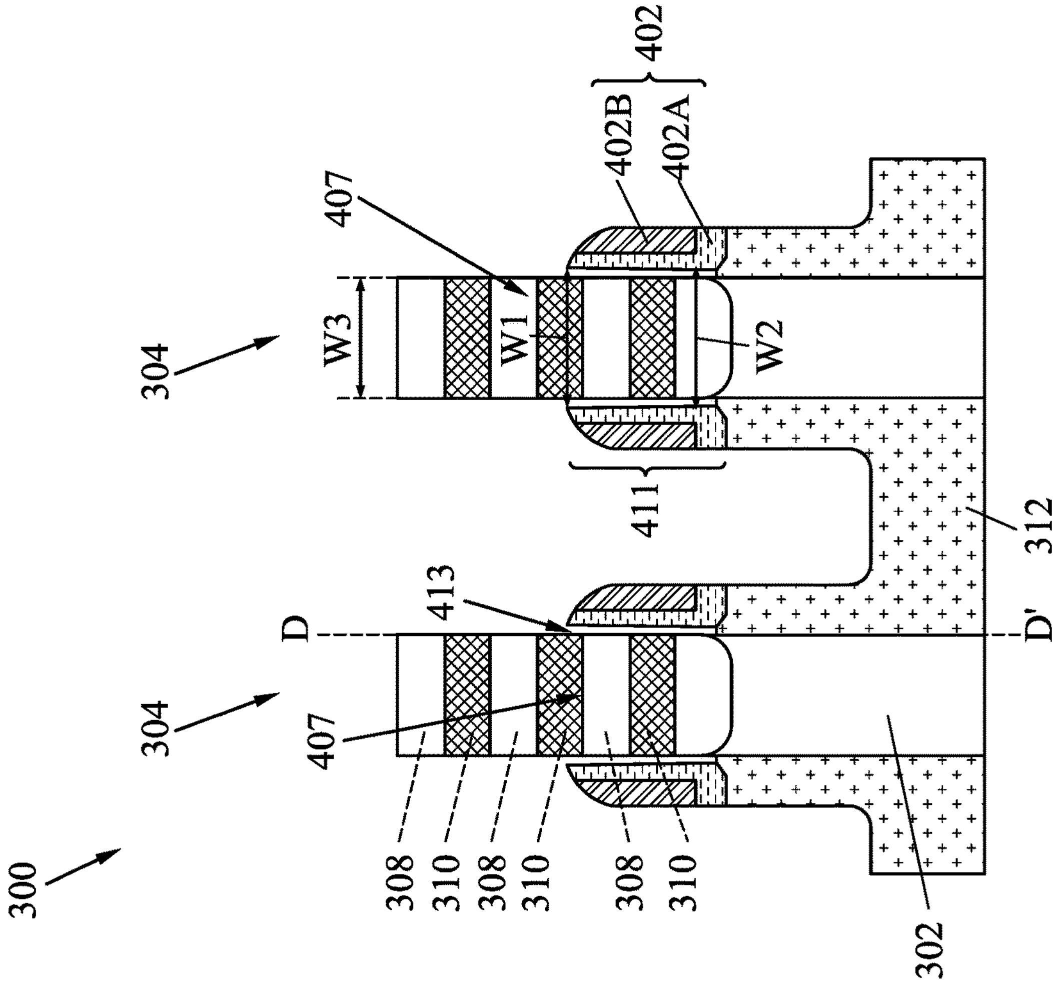

The method 200 then proceeds to block 206 where a source/drain etch process is performed. With reference to FIGS. 3A/3B and 4A/4B, in an embodiment of block 206, a source/drain etch process is performed to etch the epitaxial stack of layers 308, 310 within source/drain regions of the device 300. FIG. 4A provides a cross-sectional view of an embodiment of the device 300 along a plane substantially parallel to a plane defined by section BB' of FIG. 1 (traversing the source/drain region of the device 300), and FIG. 4B provides a cross-sectional view of an embodiment of the device 300 along a plane substantially parallel to a plane defined by section AA' of FIG. 1. It is noted that a portion of FIG. 4A that illustrates the epitaxial stack of layers 308, 310, where the reference numerals identify respective layers with dashed lines, provides a cross-sectional view of the epitaxial stack of layers 308, 310 along a plane substantially parallel to a plane defined by section CC' of FIG. 1, which is exposed after the source/drain etch process, described below. In some embodiments, and prior to etching the epitaxial stack of layers 308, 310 within source/drain regions of the device 300, a fin sidewall etching process (or sidewall spacer etch-back process) may be performed to remove portions of the spacer layer 402 from top surfaces and portions of the sidewalls of the fins 304, thereby exposing the epitaxial stack of layers 308, 310 of the fins 304 in source/drain regions of the device 300. In some cases, sidewall spacer portions 411 remain on sidewalls of at least a lower portion of the epitaxial stack of layers 308, 310 in source/drain regions of the device (e.g., after the fin sidewall etching process and before the source/drain etching process). The fin sidewall etching process may also remove portions of the spacer layer 402 from top surfaces of the gate stacks 311 and from top surfaces of the epitaxial stack of layers 308, 310 between adjacent gate stacks 311 (e.g., in source/drain regions).

Thereafter, and in a further embodiment of block 206, the source/drain etch process is performed to remove the exposed epitaxial layers 308, 310 in source/drain regions of the device 300 to form trenches 407 which expose underlying substrate portions 302 of the fins 304, as well as the epitaxial stack of layers 308, 310 along the plane defined by section CC' of FIG. 1, as noted above. In some cases, the sidewall spacer etch-back process and/or the source/drain etch process may also etch, and thus further recess, the STI features 312. In some embodiments, the fin sidewall etching process (or sidewall spacer etch-back process) and the source/drain etch process may include a dry etching process, a wet etching process, and/or a combination thereof.

In some embodiments, and because of the higher etch rate of the spacer layer 402A as compared to the spacer layer 402B, the sidewall spacer etch-back process and the source/drain etch process will etch the spacer layer 402A faster than the spacer layer 402B. As a result, the trenches 407 formed in the source/drain regions (e.g., by the source/drain etch process), and which have a trench width W1, W2 defined by a distance between opposing sidewall spacer portions 411 on either side of the trench, will have a funnel shape (e.g., a top width of the trench W1 is greater than a bottom width of the trench W2) that is formed by a combination of the sidewall spacer etch-back process and the source/drain etch process. In some embodiments, the trench funnel shape provides for at least a top portion of the trench 407 to have a width W1 that is greater than a width W3 of the lateral end of the adjacent epitaxial stack of layers 308, 310 (the fin sidewall surface). In some cases, both the top width of the trench W1 and the bottom width of the trench W2 are greater than the width W3 of the lateral end of the adjacent epitaxial stack of layers 308, 310 (the fin sidewall surface). In this case, gaps 413 may be formed between the sidewall spacer portions 411 and a plane DD' that includes a sidewall of the adjacent epitaxial stack of layers 308, 310.

Figure 5B:
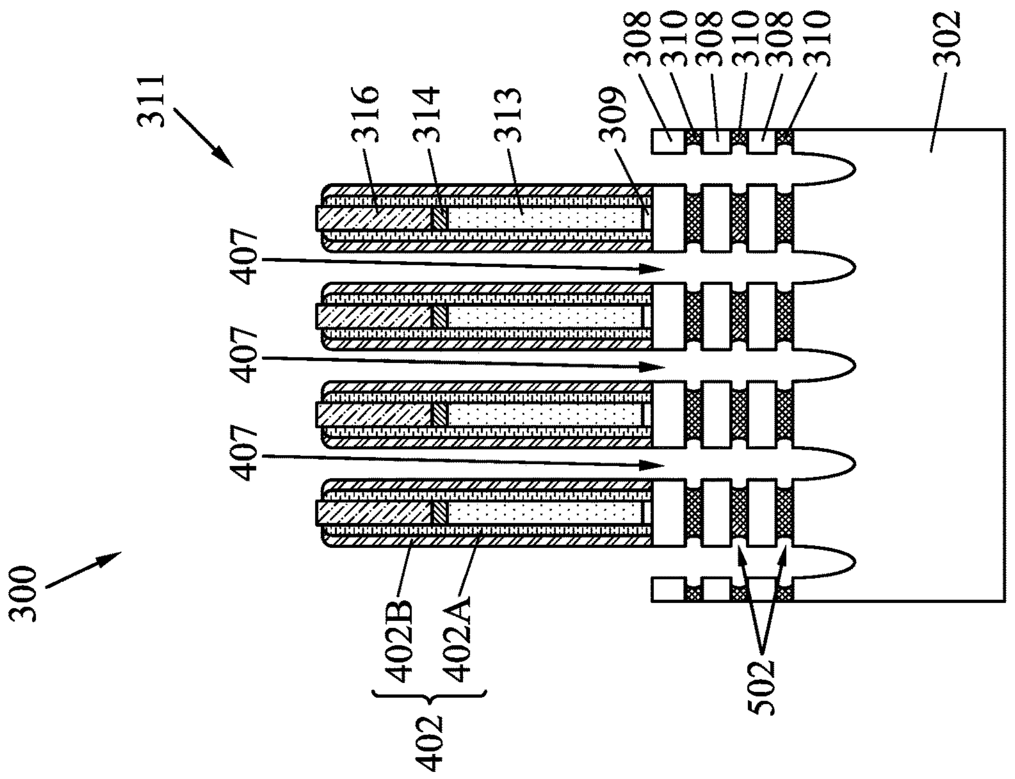
Figure 5A:
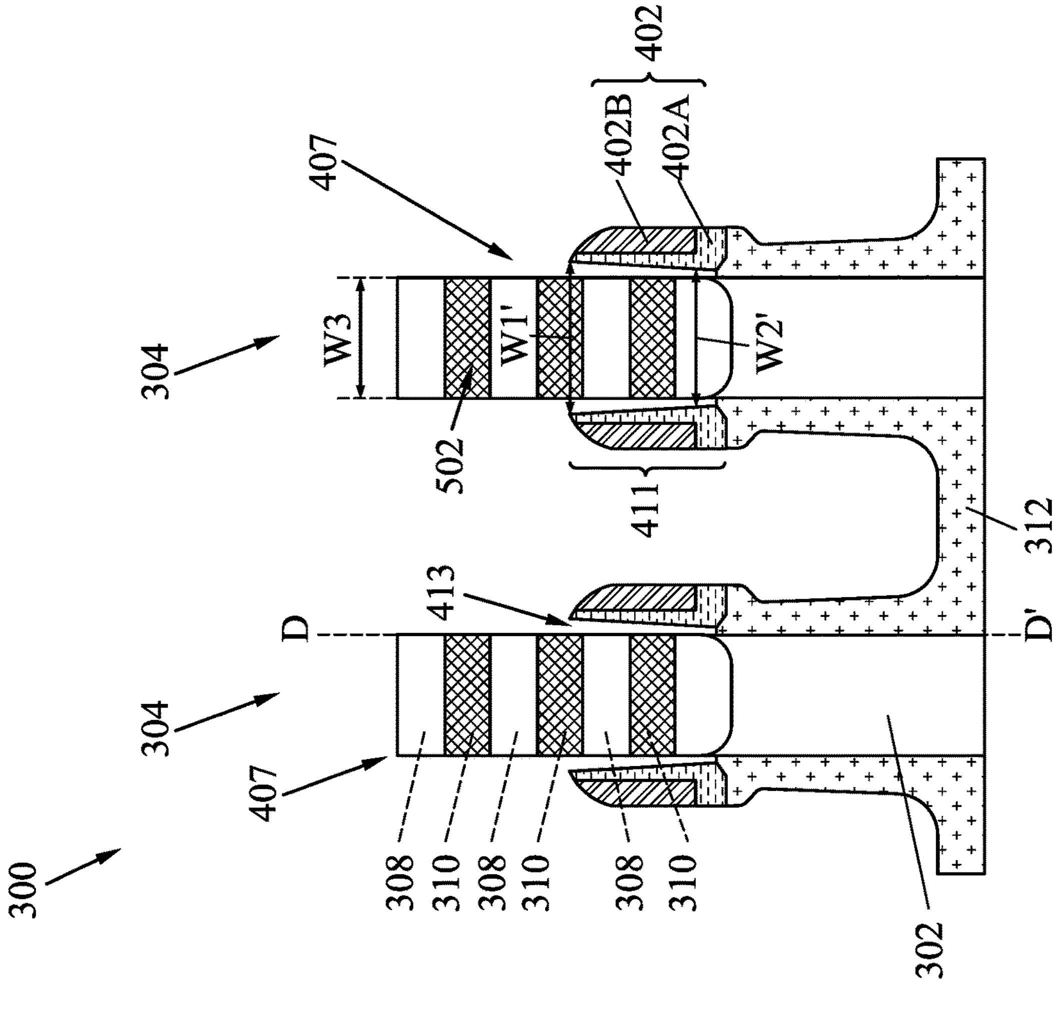
Figure 5C:
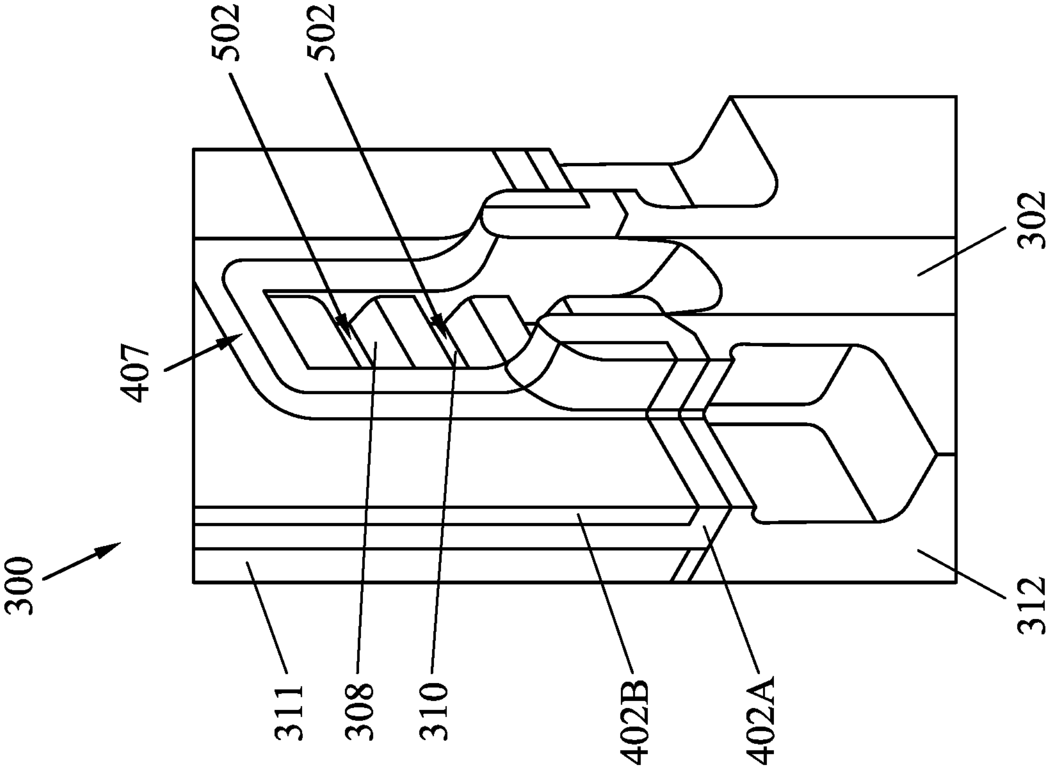
FIGS. 5C, 6C, and 7C provide isometric end views of the device 300 at different stages of processing, according to some embodiments.

The method 200 then proceeds to block 208 where a dummy layer recess process is performed. Referring to the example of FIGS. 4A/4B and 5A/5B/5C, in an embodiment of block 208, a recess of the epitaxial layers 310 (dummy layers) is performed. FIG. 5A provides a cross-sectional view of an embodiment of the device 300 along a plane substantially parallel to a plane defined by section BB' of FIG. 1 (traversing the source/drain region of the device 300), FIG. 5B provides a cross-sectional view of an embodiment of the device 300 along a plane substantially parallel to a plane defined by section AA' of FIG. 1, and FIG. 5C provides an isometric end view of the device 300 that further illustrates features of the dummy layer recess process shown in FIGS. 5A and 5B. Similar to FIG. 4A, discussed above, the portion of FIG. 5A that illustrates the epitaxial stack of layers 308, 310, where the reference numerals identify respective layers with dashed lines, provides a cross-sectional view of the epitaxial stack of layers 308, 310 along a plane substantially parallel to a plane defined by section CC' of FIG. 1.

In an embodiment of block 208, the dummy layer recess process includes a lateral etch of the epitaxial layers 310 (dummy layers) to form recesses 502 along sidewalls of the trenches 407. In some cases, the dummy layer recess process may also etch, and thus further recess, the STI features 312. In various examples, the dummy layer recess process may include a dry etching process, a wet etching process, and/or a combination thereof. In some embodiments, and once again because of the higher etch rate of the spacer layer 402A as compared to the spacer layer 402B, the dummy layer recess process will also further etch the spacer layer 402A faster than the spacer layer 402B, and may reduce the overall size of the sidewall spacer portions 411. As a result of the dummy layer recess process, the trenches 407 formed in the source/drain regions (e.g., by the source/drain etch process) will also now have a more prominent (enlarged) funnel shape with trench widths W1', W2', where a top width of the enlarged trench W1' is greater than a bottom width of the enlarged trench W2'). In some embodiments, at least the top width W1' is larger than the top width W1 (before the dummy layer recess process). In some cases, both the top width W1' and the bottom width W2' are larger than the top width W1 and the bottom width W2 (before the dummy layer recess process), respectively. Further, in some examples, the trench funnel shape provides for at least the top width W1' to be greater than the width W3 of the lateral end of the adjacent epitaxial stack of layers 308, 310 (the fin sidewall surface). In some cases, both the top width of the trench W1' and the bottom width of the trench W2' are greater than the width W3 of the lateral end of the adjacent epitaxial stack of layers 308, 310 (the fin sidewall surface). Due to the more prominent (enlarged) funnel shape created by the dummy layer recess process, and in some embodiments, the gaps 413 may also be enlarged (e.g., a distance between the sidewall spacer portions 411 and the plane DD' is increased). In some cases, the distance between the sidewall spacer portions 411 and the plane DD', which generally defines the funnel shape of the trenches 407, may be between about 3-6 nm.

Figure 6B:
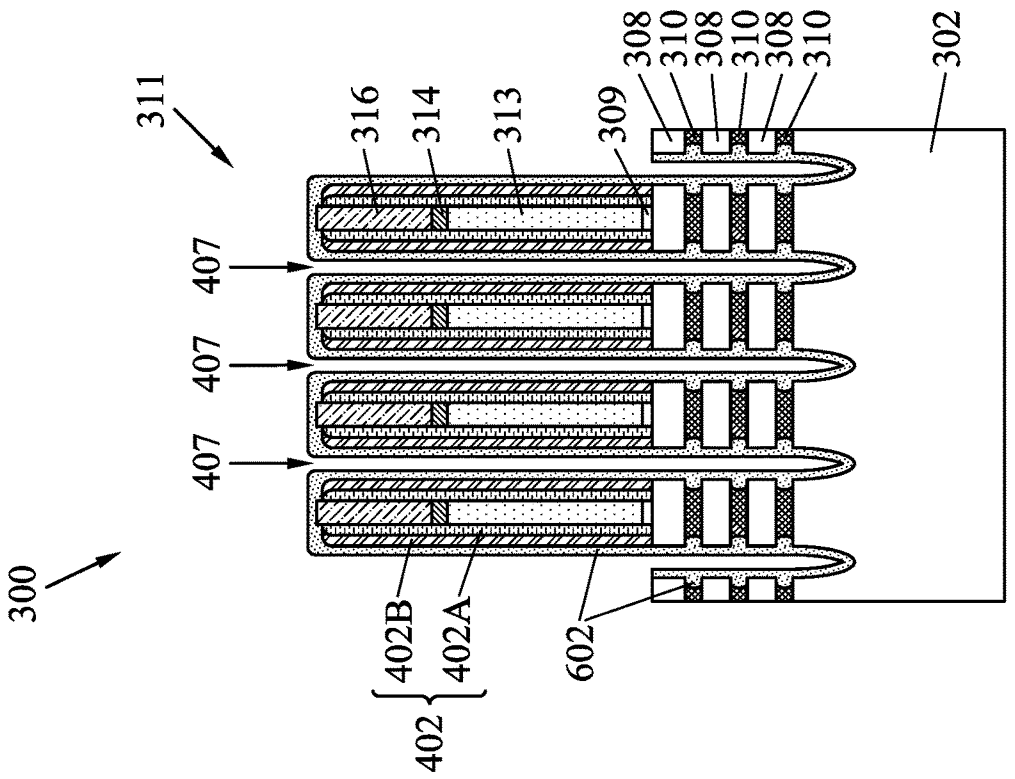
Figure 6A:
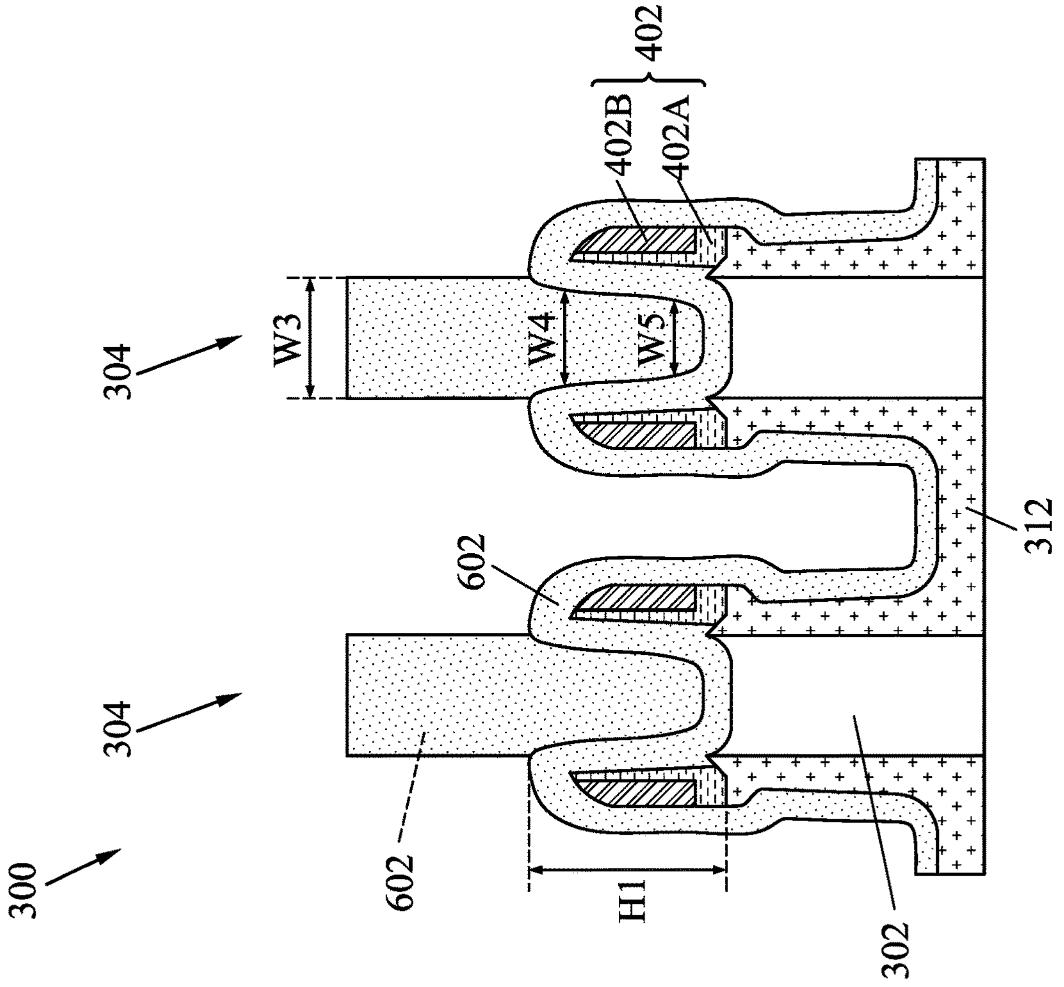
Figure 6C:
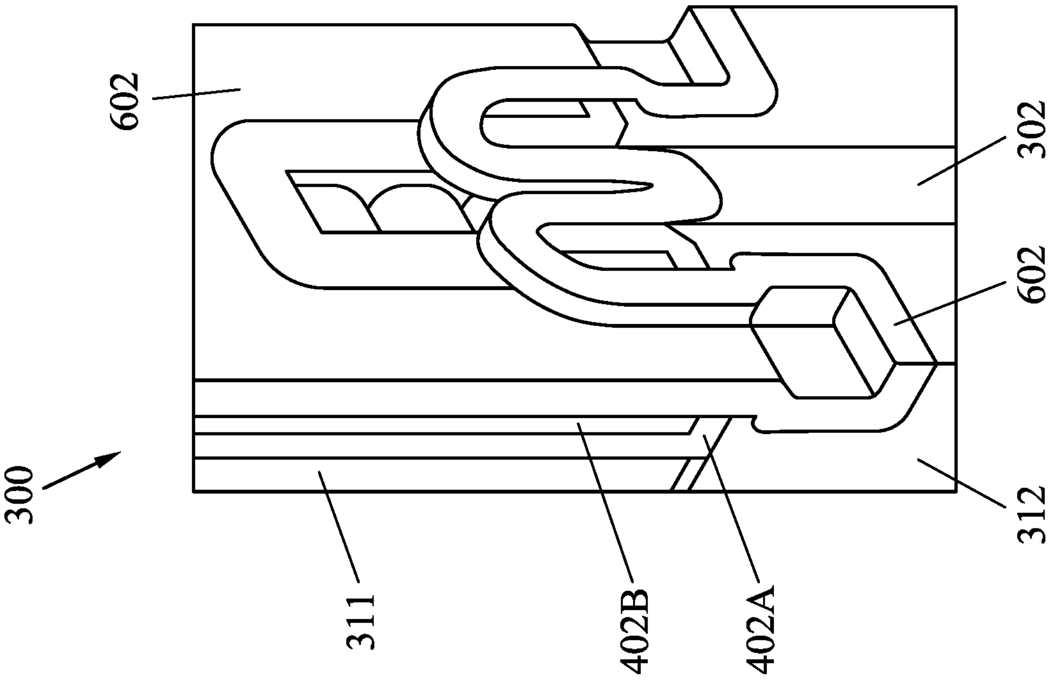

The method 200 then proceeds to block 210 where an inner spacer material is deposited. Referring to the example of FIGS. 5A/5B/5C and 6A/6B/6C, in an embodiment of block 210, an inner spacer material 602 is deposited over the device 300. FIG. 6A provides a cross-sectional view of an embodiment of the device 300 along a plane substantially parallel to a plane defined by section BB' of FIG. 1 (traversing the source/drain region of the device 300), FIG. 6B provides a cross-sectional view of an embodiment of the device 300 along a plane substantially parallel to a plane defined by section AA' of FIG. 1, and FIG. 6C provides an isometric end view of the device 300 that further illustrates features of the inner spacer material deposition process shown in FIGS. 6A and 6B. It is noted that the portion of the inner spacer material 602 identified in FIG. 6A using a dashed line provides a cross-sectional view of the device 300 along a plane substantially parallel to a plane defined by section CC' of FIG. 1, and shows the inner spacer material 602 that is deposited over the adjacent fin sidewall surface including the epitaxial stack of layers 308, 310.

In an embodiment of block 210, the inner spacer material 602 may be deposited conformally over the device 300, including along sidewalls of the trenches 407, within the recesses 502 formed along sidewalls of the trenches 407, over the adjacent fin sidewall surface including the epitaxial stack of layers 308, 310, and over the opposing sidewall spacer portions 411 on either side of the trenches 407. After deposition of the inner spacer material 602, the trenches 407 will have reduced trench widths W4, W5, where a top width W4 is greater than a bottom width W5, and where the funnel shape of the trenches 407 is preserved. In some cases, the trench widths W4, W4 may be in a range of between about 8-11 nm, and a total height H1 of the fin sidewall spacer portions 411 and the inner spacer material 602 may be in a range of between about 10-20 nm. In various examples, the reduced top trench width W4 is less than the top width W1' (before deposition of the inner spacer material 602), and the reduced bottom trench width W5 is less than the bottom width W2' (before deposition of the inner spacer material 602). Further, in some examples, the top trench width W4 and the bottom trench width W5 may be less than the width W3 of the lateral end of the adjacent epitaxial stack of layers 308, 310 (the fin sidewall surface). However, even though the effective trench width is reduced (e.g., widths W4, W5), the funnel shape of the trenches 407 ensures that the process window for a subsequent inner spacer trim process remains sufficiently large, as discussed below. Generally, in accordance with the embodiments disclosed herein, the funnel shape of the trenches 407 may provide for about a 3-6 nm increase in trench width (increase in process window) as compared to at least some existing implementations.

In some examples, the inner spacer material 602 may include a dielectric material such as SiCNx. More generally, and in various examples, the inner spacer material 602 may include silicon oxide, silicon nitride, silicon carbide, silicon oxynitride, SiCN, silicon oxycarbide, SiOCN, a low-K material (e.g., with a dielectric constant ‘k’<7), and/or combinations thereof. In some embodiments, the inner spacer material 602 may include amorphous silicon. In some embodiments, the inner spacer material 602 may have a thickness in a range of between about 3-6 nm and a dielectric constant (K value) in a range of between about 2.0-5.5. By way of example, the inner spacer material 602 may be formed by conformally depositing a dielectric material over the device 300 using processes such as a CVD process, an SACVD process, a flowable CVD process, an ALD process, a PVD process, or other suitable process.

Figure 7B:
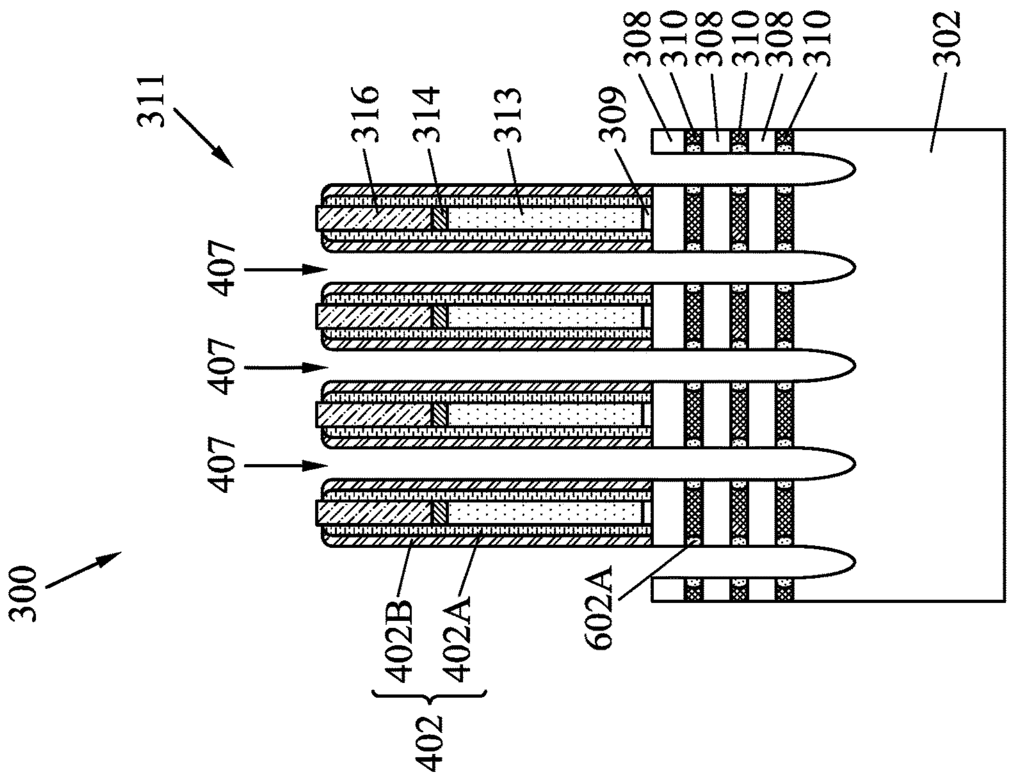
Figure 7A:
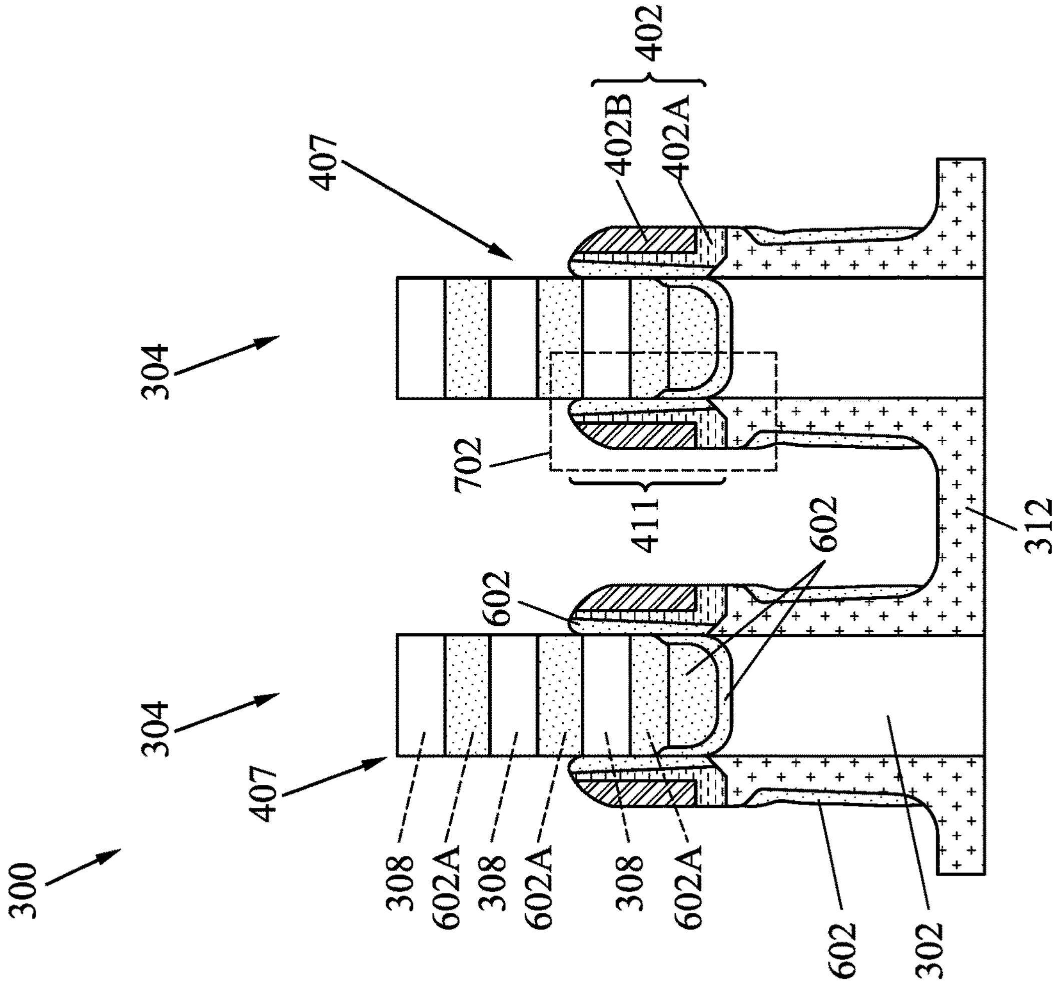
Figure 7C:
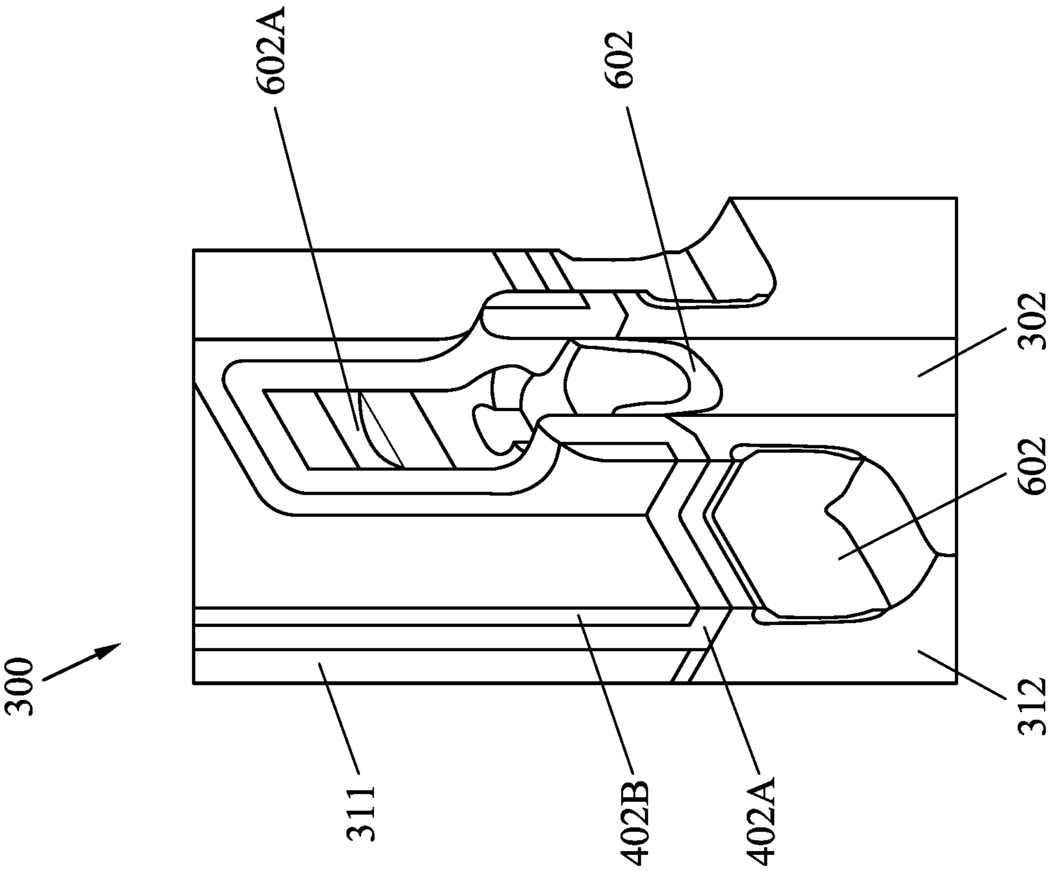

The method 200 then proceeds to block 212 where an inner spacer trim process is performed. Referring to the example of FIGS. 6A/6B/6C and 7A/7B/7C, in an embodiment of block 212, an inner spacer trim (or inner spacer etch-back) process is performed to the device 300. FIG. 7A provides a cross-sectional view of an embodiment of the device 300 along a plane substantially parallel to a plane defined by section BB' of FIG. 1 (traversing the source/drain region of the device 300), FIG. 7B provides a cross-sectional view of an embodiment of the device 300 along a plane substantially parallel to a plane defined by section AA' of FIG. 1, and FIG. 7C provides an isometric end view of the device 300 that further illustrates features of the inner spacer trim process shown in FIGS. 7A and 7B. It is noted that the portion of FIG. 7A that illustrates the epitaxial layers 308 (semiconductor channel layers) and interposing inner spacers 602A, where the reference numerals identify respective layers with dashed lines, provides a cross-sectional view of the epitaxial layers 308 and the inner spacers 602A along a plane substantially parallel to a plane defined by section CC' of FIG. 1.

After deposition of the inner spacer material layer 602, the inner spacer trim process (inner spacer etch-back process) is performed. In some embodiments, the inner spacer trim process substantially removes the inner spacer material 602 from the device 300, except for portions of the inner spacer material 602 that remain disposed within the recesses 502 formed along sidewalls of the trenches 407 after the inner spacer trim process and which define inner spacers 602A for the device 300. In some cases, and as illustrated, a thin layer of residual inner spacer material 602 may remain at the bottom of the trenches 407, along inner sidewalls of the sidewall spacer portions 411 (e.g., occupying a space previously defined by the gaps 413), and along portions of the recessed STI features 312. However, in accordance with various embodiments and because of the funnel shape of the trenches 407, the process window for inner spacer trim process is sufficiently large to ensure that substantially no inner spacer material 602 remains on lateral ends (e.g., fin sidewall surfaces) of the semiconductor channel layers (the epitaxial layers 308), including the bottommost semiconductor channel layer. As a result, source/drain features that are subsequently formed in the trenches 407, as described below, will directly contact the adjacent inner spacers 602A and the semiconductor channel layers (without any intervening inner spacer material 602). This will ensure a high-quality, low resistance contact between the source/drain features and the semiconductor channel layers (epitaxial layers 308). It is also noted that, in various examples, the inner spacers 602A may extend beneath spacer layer 402 of the gate stacks 311, and optionally at least partially beneath the electrode layer 313 of the gate stacks 311 (e.g., depending on the size of the recesses 502 formed along sidewalls of the trenches 407), while abutting subsequently formed source/drain features, described below.

Figure 8:
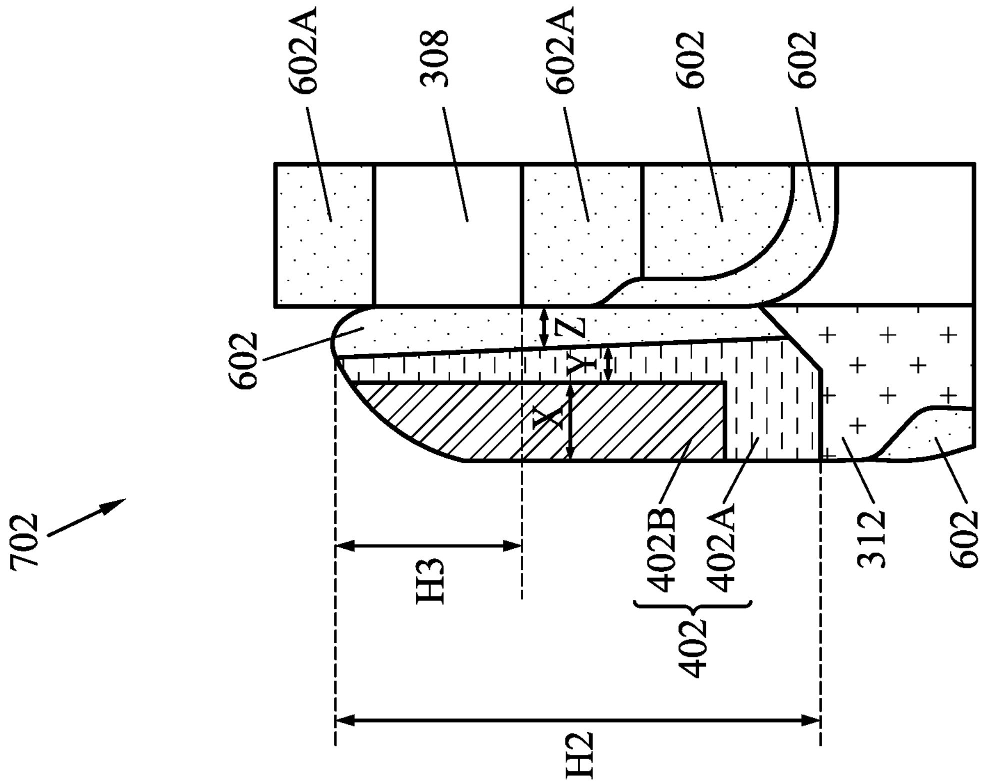
FIG. 8 provides an enlarged view of a portion of the device 300 of FIG. 7A, according to some embodiments.

To provide additional detail regarding the structure of the device 300 after the inner spacer trim process (block 212), reference is made to FIG. 8, which provides an enlarged view of a portion 702 of the device 300 of FIG. 7A. As shown, the portion 702 shows the bottommost semiconductor channel layer (bottommost epitaxial layer 308), inner spacers 602A, residual inner spacer material 602, part of the STI features 312, the spacer layer 402A, and the spacer layer 402B. As previously described, there is substantially no inner spacer material 602 that remains on lateral ends (e.g., fin sidewall surfaces) of the bottommost semiconductor channel layer, which will enhance performance of the device 300, as previously noted. Stated another way, substantially none of the inner spacer material 602 interposes lateral ends (e.g., fin sidewall surfaces) of each semiconductor channel layer 308 and an opposing surface of a subsequently formed adjacent source/drain feature 902, as discussed below. FIG. 8 also shows exemplary dimensions for various features of the device 300 (e.g., after the inner spacer trim process). For example, a thickness X of the spacer layer 402B is in a range of between about 2-5 nm, a thickness Y of the spacer layer 402A is in a range of between about 1-4 nm, and a thickness Z of the residual inner spacer material 602 along inner sidewalls of the sidewall spacer portions 411 (e.g., occupying a space previously defined by the gaps 413) is in a range of between about 0-2 nm. As previously discussed, the as-deposited thicknesses of the spacer layers 402A, 402B were each in a range of between about 3-6 nm. Thus, in accordance with various embodiments and because of the greater etch rate of the spacer layer 402A as compared to the spacer layer 402B, the final thickness of the spacer layer 402A will be less than the final thickness of the spacer layer 402B. Additionally, given the range of the thickness Z (0-2 nm) and in at least some embodiments, there is no residual inner spacer material 602 along inner sidewalls of the sidewall spacer portions 411 (e.g., occupying a space previously defined by the gaps 413). Thus, in some cases, the gaps 413 may still remain after the inner spacer trim process (block 212). FIG. 8 additionally shows a height H2 of the fin sidewall spacer portions 411 from the STI features 312 to the top of the fin sidewall spacer portions 411, and a height H3 of the fin sidewall spacer portions 411 from a plane substantially parallel with a bottom surface of the bottommost semiconductor channel layer (epitaxial layer 308) to the top of the fin sidewall spacer portions 411. In some embodiments, the height H2 may be in a range of between about 6-15 nm, and the height H3 may be in a range of between about 1-10 nm.

Figure 9B:
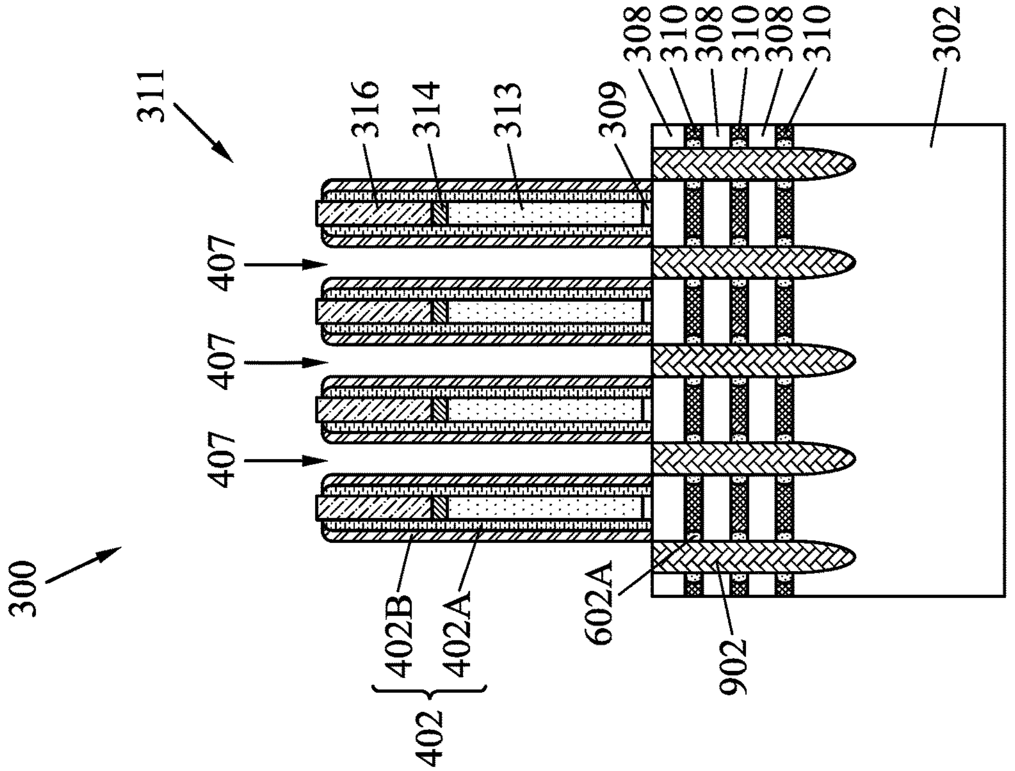
Figure 9A:
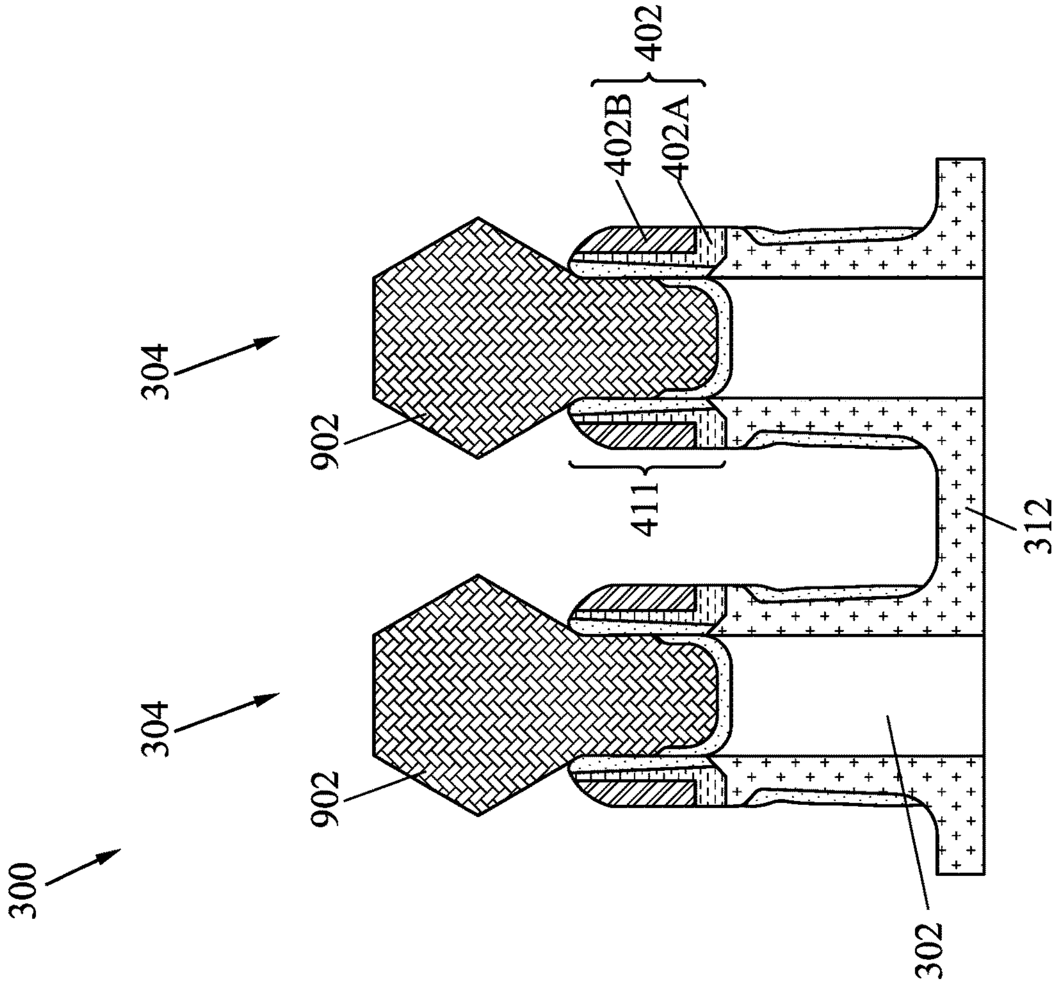

The method 200 then proceeds to block 214 where source/drain features are formed. With reference to FIGS. 7A/7B and 9A/9B, in an embodiment of block 214, source/drain features 902 are formed. FIG. 9A provides a cross-sectional view of an embodiment of the device 300 along a plane substantially parallel to a plane defined by section BB' of FIG. 1 (traversing the source/drain region of the device 300), and FIG. 9B provides a cross-sectional view of an embodiment of the device 300 along a plane substantially parallel to a plane defined by section AA' of FIG. 1. In some embodiments, the source/drain features 902 are formed in source/drain regions adjacent to and on either side of the gate stacks 311 of the device 300. For example, the source/drain features 902 may be formed within the trenches 407 of the device 300, over the exposed portions of the substrate (and/or over any residual inner spacer material 602) and in contact with the adjacent inner spacers 602A and the semiconductor channel layers (the epitaxial layers 308) of the device 300. To be sure, in some embodiments, a clean process may be performed immediately prior to formation of the source/drain features 902 to remove the residual portions of inner spacer material 602. The clean process may include a wet etch, a dry etch, or a combination thereof.

In some embodiments, the source/drain features 902 are formed by epitaxially growing a semiconductor material layer in the source/drain regions. In various embodiments, the semiconductor material layer grown to form the source/drain features 902 may include Ge, Si, GaAs, AlGaAs, SiGe, GaAsP, SiP, or other suitable material. The source/drain features 902 may be formed by one or more epitaxial (epi) processes. In some embodiments, the source/drain features 902 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 902 are not in-situ doped, and instead an implantation process is performed to dope the source/drain features 902.

In particular, and in accordance with embodiments of the present disclosure, the source/drain features 902 will directly contact the semiconductor channel layers (epitaxial layers 308), each of which has lateral ends (e.g., fin sidewall surfaces) that are substantially free of inner spacer material. As a result, the contact resistance between the source/drain features 902 and the semiconductor channel layers (epitaxial layers 308), including the bottommost semiconductor channel layer, will be improved (reduced). In addition, and because the lateral ends of the semiconductor channel layers are substantially free of inner spacer material, the epitaxial growth quality of the source/drain features 902 will be improved. There is also no additional process cost associated with the various embodiments disclosed herein.

Generally, the semiconductor device 300 may undergo further processing to form various features and regions known in the art. For example, subsequent processing may form inter-layer dielectric (ILD) layers, may remove the dummy gate stacks 311, may perform a semiconductor channel release process (e.g., including selective removal of the epitaxial SiGe layers 310), and may form a high-K/metal gate stack, contact openings, contact metal, as well as various contacts/vias/lines and multilayer interconnect features (e.g., metal layers and interlayer dielectrics) on the substrate, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor, it will be understood that other device configurations are possible.

With respect to the description provided herein, disclosed are methods and structures for providing multi-gate devices (e.g., such as a GAA transistors) having improved dummy gate sidewall spacers for inner spacer formation. In some embodiments, fins including an epitaxial stack of layers and one or more dummy gate stacks formed over the epitaxial stack of layers are provided. The dummy gate stacks include one or more sidewall spacers which include a multi-layer sidewall spacer with constituent layers having different etch rates. For example, the sidewall spacers may include a bilayer sidewall spacer where a first layer of the bilayer sidewall spacer is formed over the dummy gates and over the epitaxial stack of layers in source/drain regions of the device. Thereafter, a second layer of the bilayer sidewall spacer is formed over the first layer of the bilayer sidewall spacer. In some cases, the first layer of the bilayer sidewall spacer has a greater etch rate than the second layer of the bilayer sidewall spacer. After forming the first and second layers of the bilayer sidewall spacer, a sidewall spacer etch-back process and source/drain etch process is performed. In some embodiments, and because of the higher etch rate of the first layer of the bilayer sidewall spacer, the sidewall spacer etch-back process and/or the source/drain etch process will etch the first layer of the bilayer sidewall spacer faster than the second layer of the bilayer sidewall spacer. As a result, the trenches formed in the source/drain regions, and which have a trench width defined by a distance between opposing sidewall spacer portions on either side of the trench, will have a funnel shape (e.g., a top width of the trench is greater than a bottom width of the trench). After performing a dummy layer recess process, an inner spacer material is deposited over the device, including along sidewalls of the trenches, within the recesses (e.g., within which inner spacers are defined), and over the opposing sidewall spacer portions on either side of each of the trenches. The deposition of the inner spacer material over the opposing sidewall spacer portions on either side of each of the trenches may effectively reduce the trench width; however, because of the funnel shape of the trenches, the process window for the subsequent inner spacer trim process remains sufficiently large. Thus, when the deposited inner spacer material is subsequently etched-back (trimmed) to form the inner spacers, substantially no inner spacer material remains on lateral ends of the semiconductor channel layers of the epitaxial stack of layers, including the bottommost semiconductor channel layer. As a result, source/drain features that are subsequently formed within the trenches will contact the adjacent inner spacers and the semiconductor channel layers, each of which has lateral ends (e.g., fin sidewall surfaces) that are substantially free of inner spacer material. Therefore, contact resistance between the source/drain features and the semiconductor channel layers will be improved (reduced) to provide enhanced device performance, epitaxial growth quality of the source/drain features will be improved, and there is no extra process cost. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method including providing a fin extending from a substrate, where the fin includes a plurality of semiconductor channel layers, and where a gate structure is disposed over the fin. The method further includes depositing a first spacer layer over the gate structure and over the fin in a source/drain region adjacent to the gate structure, where the first spacer layer has a first etch rate. The method further includes depositing a second spacer layer over the first spacer layer, where the second spacer layer has a second etch rate less than the first etch rate. The method further includes removing the plurality of semiconductor channel layers from the source/drain region to form a trench having a funnel shape in the source/drain region. The method further includes after forming the trench having the funnel shape, forming inner spacers along a sidewall surface of the trench, the inner spacers interposing adjacent semiconductor channel layers of the plurality of semiconductor channel layers, where lateral sidewall surfaces of each semiconductor channel layer of the plurality of semiconductor channel layers is substantially free of an inner spacer material.

In another of the embodiments, discussed is a method that includes forming a dummy gate over a fin including plural channel layers. The method further includes forming a bilayer sidewall spacer on a sidewall of the dummy gate and along opposing sidewalls of the fin in a source/drain region adjacent to the dummy gate. The method further includes performing a source/drain etch process to remove the plural channel layers from the source/drain region to form a trench having a width defined by a distance between the opposing bilayer sidewall spacers remaining in the source/drain region, where a top width of the trench is greater than a bottom width of the trench. The method further includes after forming the trench, forming inner spacers along a sidewall surface of the trench and between adjacent channel layers of the plural channel layers, where lateral ends of a bottommost channel layer of the plural channel layers are free of an inner spacer material.

In yet another of the embodiments, discussed is a semiconductor device including a gate structure formed over a fin, where the fin includes a source/drain region adjacent to the gate structure. The semiconductor device further includes a source/drain feature disposed within the source/drain region. The semiconductor device further includes sidewall spacer portions disposed within the source/drain region and on opposing sides of the source/drain feature, where the sidewall spacer portions define a trench having a funnel shape, and where at least a bottom portion of the source/drain feature is disposed within the trench having the funnel shape. In some embodiments, the fin includes a plurality of semiconductor channel layers interposed by a plurality of inner spacers composed of an inner spacer material, where lateral sidewall surfaces of each semiconductor channel layer of the plurality of semiconductor channel layers is substantially free of an inner spacer material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

providing a fin extending from a substrate, wherein the fin includes a plurality of semiconductor channel layers, and wherein a gate structure is disposed over the fin;

depositing a first spacer layer interfacing the gate structure and interfacing the fin in a source/drain region adjacent to the gate structure, wherein the first spacer layer has a first etch rate, and wherein the gate structure extends in a first direction;

depositing a second spacer layer interfacing the first spacer layer, wherein the second spacer layer has a second etch rate less than the first etch rate;

removing the plurality of semiconductor channel layers from the source/drain region to form a trench having a funnel shape in the source/drain region, wherein the trench is defined by portions of the first and second spacer layers that remain in the source/drain region after the removing the plurality of semiconductor channel layers and prior to formation of inner spacers, wherein the trench has different top and bottom trench widths, the top and bottom trench widths defined along a first plane that spans multiple source/drain regions, and wherein the first plane is parallel to the first direction in a top-down view; and after forming the trench having the funnel shape, forming the inner spacers along a sidewall surface of the trench, the inner spacers interposing adjacent semiconductor channel layers of the plurality of semiconductor channel layers, wherein lateral sidewall surfaces of each semiconductor channel layer of the plurality of semiconductor channel layers are substantially free of an inner spacer material.

2. The method of claim 1, further comprising:

prior to forming the trench, performing a fin sidewall etching process to remove portions of the first and second spacer layers from a top surface and part of a sidewall surface of the fin, wherein a sidewall spacer portion, defined by the portions of the first and second space layers, remains on at least a lower portion of sidewall surfaces of the fin within the source/drain region.

3. The method of claim 2, wherein the top and bottom trench widths are defined by a distance between opposing sidewall spacer portions on either side of the trench.

4. The method of claim 1, wherein the top trench width is greater than the bottom trench width.

5. The method of claim 1, further comprising:

prior to forming the inner spacers, performing a dummy layer recess process to form recesses along sidewalls of the trench within which the inner spacers are subsequently formed, wherein the dummy layer recess process increases a size of the trench having the funnel shape.

6. The method of claim 2, wherein forming the trench having the funnel shape forms a gap between the sidewall spacer portion and a second plane that includes a sidewall of the fin disposed beneath the adjacent gate structure.

7. The method of claim 5, wherein the forming the inner spacers further comprises:

conformally depositing the inner spacer material along sidewalls of the trench, within the recesses, and over opposing sidewall spacer portions on either side of the trench; and performing an inner spacer trim process to substantially remove the inner spacer material except for portions of the inner spacer material disposed within the recesses.

8. The method of claim 7, wherein the inner spacer trim process removes the inner spacer material from the lateral sidewall surfaces of each semiconductor channel layer of the plurality of semiconductor channel layers.

9. The method of claim 1, further comprising:

after forming the inner spacers, forming a source/drain feature in the trench having the funnel shape in the source/drain region, wherein the source/drain feature directly contacts the lateral sidewall surfaces of each semiconductor channel layer of the plurality of semiconductor channel layers.

10. A method of fabricating a semiconductor device, comprising:

forming a dummy gate over a fin including plural channel layers, wherein the dummy gate extends in a first direction;

forming a bilayer sidewall spacer interfacing a sidewall of the dummy gate and interfacing opposing sidewalls of the fin in a source/drain region adjacent to the dummy gate;

performing a source/drain etch process to remove the plural channel layers from the source/drain region to form a trench having a width defined by a distance between the opposing bilayer sidewall spacers remaining in the source/drain region after the source/drain etch process and prior to formation of inner spacers, wherein a top width of the trench is greater than a bottom width of the trench, wherein the top and bottom widths of the trench are defined along a plane that spans multiple source/drain regions, and wherein the plane is parallel to the first direction in a top-down view; and after forming the trench, forming the inner spacers along a sidewall surface of the trench and between adjacent channel layers of the plural channel layers, wherein lateral ends of a bottommost channel layer of the plural channel layers are free of an inner spacer material.

11. The method of claim 10, further comprising:

prior to forming the inner spacers, forming recesses along the sidewall surface of the trench; and forming the inner spacers within the recesses.

12. The method of claim 11, wherein the forming the recesses increases at least the top width of the trench.

13. The method of claim 11, wherein the forming the recesses decreases a size of the bilayer sidewall spacer disposed along the opposing sidewalls of the fin in the source/drain region.

14. The method of claim 10, wherein constituent layers of the bilayer sidewall spacer have different etch rates.

15. The method of claim 10, wherein an inner sidewall spacer layer of the bilayer sidewall spacer has a greater etch rate than an outer sidewall spacer layer of the bilayer sidewall spacer.

16. The method of claim 11, wherein the forming the inner spacers further comprises:

depositing the inner spacer material over the semiconductor device; and performing an inner spacer trim process to remove the inner spacer material except for portions of the inner spacer material disposed within the recesses, wherein the inner spacer trim process removes the inner spacer material from lateral ends of each channel layer of the plural channel layers.

17. The method of claim 10, further comprising:

after forming the inner spacers, forming a source/drain feature in the trench, wherein the source/drain feature directly contacts a lateral end of each channel layer of the plural channel layers.

18. A semiconductor device, comprising:

a gate structure formed over a fin, wherein the fin includes a source/drain region adjacent to the gate structure, and wherein the gate structure extends in a first direction;

a source/drain feature disposed within the source/drain region; and a gate sidewall spacer including first gate sidewall spacer portions that interface the gate structure and second sidewall spacer portions disposed within the source/drain region and on opposing sides of the source/drain feature, wherein the second sidewall spacer portions define a trench having a funnel shape, wherein at least a bottom portion of the source/drain feature is disposed within the trench having the funnel shape, wherein the funnel shape of the trench is defined along a plane that spans multiple source/drain regions, and wherein the plane is parallel to the first direction in a top-down view;

wherein the fin includes a plurality of semiconductor channel layers interposed by a plurality of inner spacers, wherein the plurality of semiconductor channel layers and the plurality of inner spacers are adjacent to the source/drain feature, wherein the plurality of inner spacers are composed of an inner spacer material, and wherein substantially none of the inner spacer material interposes lateral sidewall surfaces of each semiconductor channel layer of the plurality of semiconductor channel layers and an opposing surface of the adjacent source/drain feature.

19. The semiconductor device of claim 18, wherein the opposing surface of the adjacent source/drain feature directly contacts the lateral sidewall surfaces of each semiconductor channel layer of the plurality of semiconductor channel layers.

20. The semiconductor device of claim 18, wherein the second sidewall spacer portions include an inner sidewall spacer layer having a first thickness and an outer sidewall spacer layer having a second thickness greater than the first thickness.

* * * * *